(12) United States Patent
Sano et al.

(10) Patent No.: US 10,469,020 B2
(45) Date of Patent: Nov. 5, 2019

(54) POWER CONVERSION APPARATUS

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Tomohisa Sano, Kariya (JP); Yuu Yamahira, Kariya (JP); Yoshihito Mizuno, Nagakute (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/494,839

(22) Filed: Apr. 24, 2017

(65) Prior Publication Data

US 2017/0310270 A1    Oct. 26, 2017

(30) Foreign Application Priority Data

Apr. 25, 2016    (JP) .................................. 2016-087169

(51) Int. Cl.
*H02P 29/00* (2016.01)
*H02P 29/68* (2016.01)
(Continued)

(52) U.S. Cl.
CPC ............ *H02P 29/68* (2016.02); *H02M 3/158* (2013.01); *H02M 7/5387* (2013.01);
(Continued)

(58) Field of Classification Search
CPC ...... H02M 7/5387; H02P 27/06; H02P 29/68; H05K 7/20945
See application file for complete search history.

(56) References Cited

U.S. PATENT DOCUMENTS

2008/0291589 A1* 11/2008 Yokai ...................... H02P 6/182
                                                                  361/33
2010/0327837 A1* 12/2010 Tsugawa ................. H02M 1/32
                                                                  323/285
(Continued)

FOREIGN PATENT DOCUMENTS

JP    2008-206345 A    9/2008
WO    2016/021314 A1   2/2016

*Primary Examiner* — Muhammad S Islam
(74) *Attorney, Agent, or Firm* — Oliff PLC

(57) ABSTRACT

A power conversion apparatus includes a power conversion circuit and a control unit. The power conversion circuit converts electric power supplied from a power supply and outputs the converted electric power. The control unit controls the power conversion circuit. The power conversion circuit has at least one phase that is configured as a parallel-connection phase in which two semiconductor elements are connected in parallel to each other in each of an upper arm connected to a high potential-side wiring of the power supply and a lower arm connected to a low potential-side wiring of the power supply. The control unit detects temperature information related to element temperatures of all of the plurality of semiconductor elements of a target arm that is either of the upper arm and the lower arm of the parallel-connection phase, and performs overheating protection control of the power conversion circuit based on the detected temperature information.

12 Claims, 8 Drawing Sheets

(51) Int. Cl.
*H02M 7/5387* (2007.01)
*H02P 27/06* (2006.01)
*H05K 7/20* (2006.01)
*H02M 3/158* (2006.01)
*H02M 1/088* (2006.01)
*H02M 1/00* (2006.01)
*H02M 1/32* (2007.01)

(52) U.S. Cl.
CPC ......... *H02P 27/06* (2013.01); *H05K 7/20927* (2013.01); *H05K 7/20945* (2013.01); *H02M 1/088* (2013.01); *H02M 2001/007* (2013.01); *H02M 2001/008* (2013.01); *H02M 2001/327* (2013.01)

(56) References Cited

U.S. PATENT DOCUMENTS

| | | | |
|---|---|---|---|
| 2011/0085363 A1* | 4/2011 | Gupta | H02M 7/5387 363/131 |
| 2012/0249021 A1* | 10/2012 | Hamanaka | H02P 27/06 318/139 |
| 2013/0175012 A1* | 7/2013 | Yamada | H05K 999/99 165/121 |
| 2013/0272046 A1* | 10/2013 | Matsuoka | H02M 7/5387 363/132 |
| 2014/0118866 A1* | 5/2014 | Iwami | H02H 7/08 361/25 |

* cited by examiner

POWER CONVERSION APPARATUS

CROSS-REFERENCE TO RELATED APPLICATION

This application is based on and claims the benefit of priority from Japanese Patent Application No. 2016-087169, filed Apr. 25, 2016. The entire disclosure of the above application is incorporated herein by reference.

BACKGROUND

Technical Field

The present disclosure relates to a power conversion apparatus that converts electric power supplied from a power supply and outputs the converted electric power.

Related Art

A power conversion apparatus that performs power conversion is mounted to vehicles such as electric cars and hybrid cars. For example, JP-A-2008-206345 discloses a power conversion apparatus that is provided with a plurality of semiconductor modules that include semiconductor elements therein. The power conversion apparatus includes a power conversion circuit and a control unit. The power conversion circuit converts electric power supplied from a power supply and outputs the converted electric power. The control unit controls the power conversion circuit. The control unit detects the element temperature of the semiconductor element that has the greatest increase in temperature. The control unit then performs overheating protection control for the power conversion circuit based on the detected element temperature.

Issues such as that below arise in the above-described power conversion apparatus disclosed in JP-A-2008-206345, regarding overheating protection control of the power conversion circuit.

That is, as a result of individual differences among the semiconductor modules and the semiconductor elements, and the like, the power conversion apparatus may generate a state in which the current flowing through each semiconductor element differs in magnitude during operation of the semiconductor modules (referred to, hereafter, as a current imbalance state). For example, the current imbalance state occurs when, in a phase in which two semiconductor elements are connected in parallel to each other in both an upper arm and a lower arm, currents of differing magnitude flow through the two semiconductor elements.

In such cases, should temperature information of only the semiconductor element having the smaller current be detected, it is conceivable that the element temperature of the semiconductor element through which the larger current flows will significantly exceed a management temperature (threshold) set in advance. Therefore, in the designing this type of power conversion apparatus, it is necessary to take into consideration the current imbalance state when overheating protection control of the power conversion circuit is performed.

SUMMARY

It is thus desired to provide a power conversion apparatus that is capable of performing overheating protection control of a power conversion circuit, taking into consideration a current imbalance state.

An exemplary embodiment of the present disclosure provides a power conversion apparatus that includes a power conversion circuit that converts electric power supplied from a power supply and outputs the converted electric power, and a control unit that controls the power conversion circuit. The power conversion circuit has at least one phase that is configured as a parallel-connection phase in which a plurality of semiconductor elements are connected in parallel to each other in each of an upper arm connected to a high potential-side wiring of the power supply and a lower arm connected to a low potential-side wiring of the power supply. The control unit detects temperature information related to element temperatures of all of the plurality of semiconductor elements of a target arm that is either of the upper arm and the lower arm of the parallel-connection phase, and performs overheating protection control of the power conversion circuit based on the detected temperature information.

In the above-described power conversion apparatus, the temperature information related to the element temperatures of all of the plurality of semiconductor elements of the target arm is detected for overheating protection control. Overheating protection control is then performed based on the temperature information. Therefore, even should a current imbalance state occur between the plurality of semiconductor elements, excessive increase in the element temperatures of the semiconductor elements can be prevented. That is, overheating protection control that takes into consideration the current imbalance state can be performed.

In addition, the semiconductor elements of only the target arm, of the upper arm and the lower arm, are the temperature detection subjects. Therefore, compared to when the semiconductor elements of both arms are the temperature detection subjects, the number of temperature detection subjects can be reduced. Therefore, processing load placed on the control unit can be reduced and greater efficiency can be achieved.

As described above, according to the above-described exemplary embodiment, in the power conversion apparatus, overheating protection control can be performed taking into consideration the current imbalance state.

Reference numbers within the parentheses in the claims and the summary of the invention indicate corresponding relationships with specific means according to an embodiment described hereafter, and do not limit the technical scope of the present disclosure.

DESCRIPTION OF THE EMBODIMENTS

Figure 1:
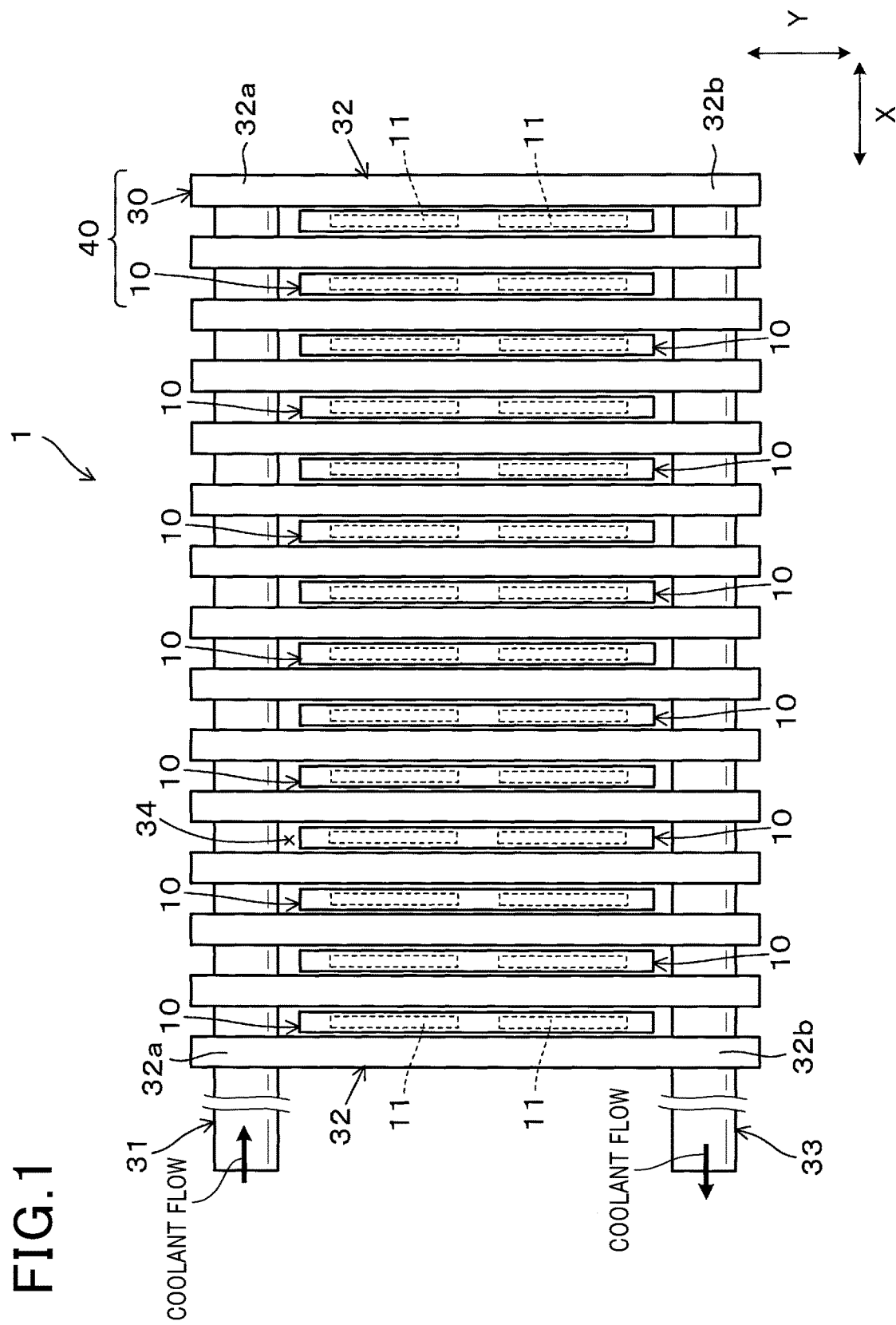
FIG. 1 is a plan view of a power conversion apparatus according to a present embodiment.

An embodiment of a power conversion apparatus will hereinafter be described with reference to the drawings.

In the drawings of the present specification, unless otherwise noted, a first direction is indicated by arrow X and a second direction is indicated by arrow Y. The first direction is a lamination direction of semiconductor modules and cooling tubes in a semiconductor laminated unit. The second direction is a width direction of the semiconductor module and a length direction of the cooling tube in the semiconductor laminated unit.

A power conversion apparatus 1 according to the present embodiment is mounted to an electric car, a hybrid car, or the like. The power conversion apparatus 1 is used as an inverter that converts direct-current power-supply power to alternating-current power that is required to drive a drive motor.

As shown in FIG. 1, the power conversion apparatus 1 includes a semiconductor laminated unit 40. The semiconductor laminated unit 40 includes a plurality of semiconductor modules 10 and a cooler 30. Each of the plurality of semiconductor modules 10 includes semiconductor elements 11 therein. The cooler 30 cools the plurality of semiconductor modules 10.

The cooler 30 includes an inflow tube 31, a plurality of cooling tubes 32, and an outflow tube 33. In FIG. 1, the cooler 30 has fifteen cooling tubes 32. In the cooler 30, a coolant (refrigerant) that flows in through the inflow tube 31 flows from upstream-side end portions 32a of the plurality of cooling tubes 32 towards downstream-side end portions 32b. The coolant then flows out through the outflow tube 33. That is, the coolant flows in parallel through the plurality of cooling tubes 32. As the coolant, for example, a natural coolant such as water or ammonia, water mixed with an ethylene glycol-based antifreezing solution, a fluorocarbon-based coolant such as Fluorinert (registered trademark), a chlorofluorocarbon-base coolant such as HCFC 123 or HFC 134a, an alcohol-based coolant such as methanol or alcohol, or a ketone-based coolant such as acetone can be used.

In the semiconductor laminated unit 40, the plurality of cooling tubes 32 of the cooler 30 and the plurality of semiconductor modules 10 are arranged such as to be alternately laminated in the first direction X. The plurality of cooling tubes 32 are arranged parallel with the first direction X, with spaces 34 therebetween and with the second direction Y as the length direction thereof. The semiconductor module 10 is interposed between two cooling tubes 32 that are adjacent to each other, in the space 34.

The semiconductor module 10 is sandwiched from both side surfaces in the first direction X by the two cooling tubes 32, in the state in which the semiconductor module 10 is arranged in the interposing manner in the space 34. Thus, the semiconductor module 10 is cooled from both side surfaces in the first direction X by the coolant flowing through the two cooling tubes 32. That is, the semiconductor module 10 is cooled as a result of heat generated in the semiconductor module 10 moving towards the coolant flowing through the two cooling tubes 32. The above-described cooler 30 is also referred to as a laminated type cooler (stacked type cooler) and is effective in increasing the surface area effective for cooling.

Figure 2:
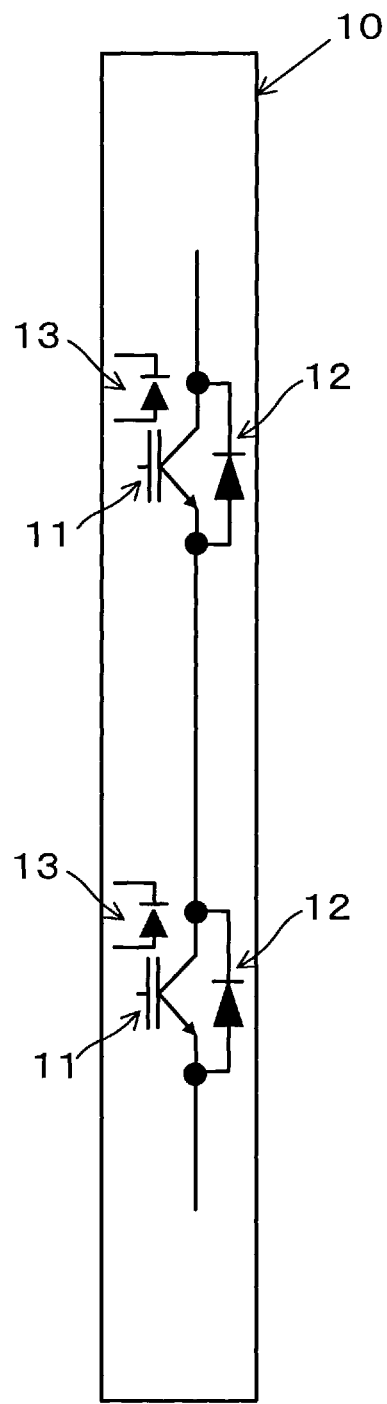
FIG. 2 is a diagram of an equivalent circuit of each semiconductor module in the power conversion apparatus in FIG. 1.

As shown in FIG. 2, two semiconductor elements (also referred to as switching elements) 11 are serially connected in the semiconductor module 10. For example, the semiconductor element 11 is an insulated-gate bipolar transistor (IGBT). A diode 12 is connected between a collector and an emitter of each semiconductor element 11, so as to cause a current to flow from the emitter side to the collector side via the diode 12.

In addition, the semiconductor module 10 includes temperature-sensitive diodes 13. The temperature-sensitive diode 13 serves as a detection element that detects temperature information related to the element temperature of the semiconductor element 11. The semiconductor module 10 is electrically connected to a control unit (control unit 8 in FIG. 3) that controls the switching operation of the semiconductor elements 11. Therefore, the temperature information detected by the temperature-sensitive diode 13 is transmitted to the control unit 8. The temperature information herein includes various types of information enabling the element temperature of the semiconductor element 11 to be determined.

Figure 3:
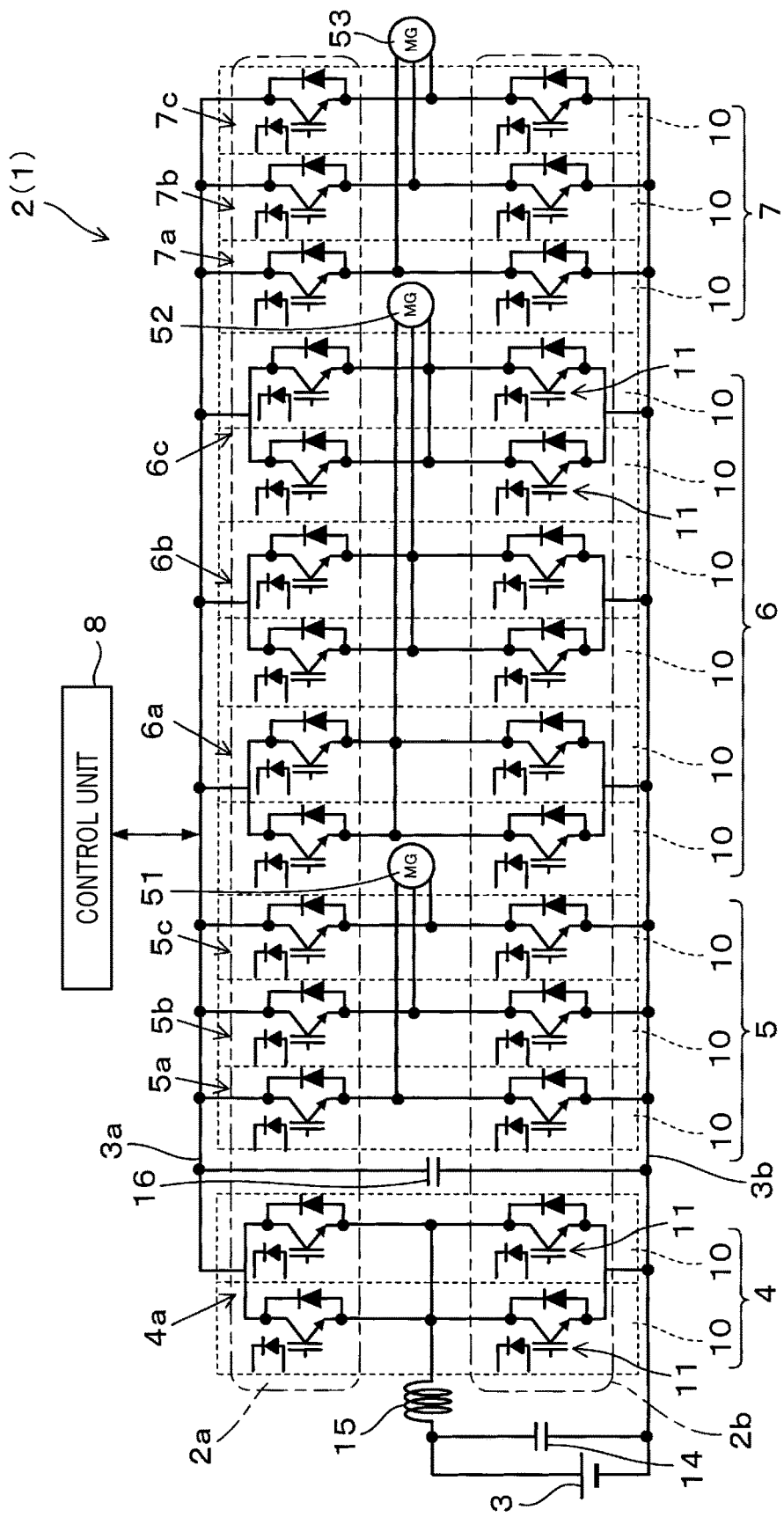
FIG. 3 is a diagram of a power conversion circuit of the power conversion apparatus in FIG. 1.

As shown in FIG. 3, a power conversion circuit 2 that serves as an inverter circuit of the power conversion apparatus 1 is configured by a plurality of the semiconductor module 10 shown in FIG. 2 being combined (according to the present embodiment, the power conversion circuit 2 includes fourteen semiconductor modules 10). In addition, the power conversion circuit 2 includes a power supply 3, capacitors 14 and 16, and a reactor 15. The control unit 8 is configured by an electronic control unit (ECU).

In the power conversion circuit 2, an upper arm 2a is a section of each semiconductor module 10 that is connected to a high potential-side wiring 3a of the power supply 3. A lower arm 2b is a section of each semiconductor module 10 that is connected to a low potential-side wiring 3b of the power supply 3. The power conversion circuit 2 is joined to the cooling tubes 32 of the cooler 30.

For example, the power supply 3 is configured as a high-voltage, direct-current battery composed of a plurality of secondary battery cells that are serially connected. The secondary battery cell is a nickel-hydrogen battery, a lithium ion battery, or the like. The power supply 3 can also be composed of capacitors, fuel cells, or the like, except for the secondary battery.

The voltage of the power supply 3 is boosted by a booster circuit. The booster circuit includes the circuits of two semiconductor modules 10, the capacitor 14, and the reactor 15. At this time, the capacitor 14 functions to absorb ripple currents included in the power supply current and stabilize the power supply voltage. The reactor 15 is configured by an inductor (a coil that is a passive component) that converts electric energy to magnetic energy. The capacitor 16 functions to smoothen the voltage outputted from the booster circuit.

The plurality of semiconductor modules 10 are classified into a booster module 4 and motor modules 5, 6, and 7.

The booster module 4 is used to boost the voltage of the power supply 3. The boost module 4 is composed of the two semiconductor modules 10 in the first and second rows from the left in FIG. 1. A single phase 4a is formed by the circuits of the two semiconductor modules 10. The phase 4a is a parallel-connection phase in which the two semiconductor elements 11 of the upper arm 2a are connected in parallel to each other, and the two semiconductor elements 11 of the lower arm 2*b* are connected in parallel to each other. That is, in the booster module 4, the single phase 4*a* is configured as a parallel-connection phase in which the two semiconductor elements 11 are connected in parallel to each other in each of the upper arm 2*a* and the lower arm 2*b*.

The motor module 5 is used for a three-phase alternating-current motor 51. The motor module 5 is composed of the three semiconductor modules 10 in the third to fifth rows from the left in FIG. 1. Three phases 5*a*, 5*b*, and 5*c* are formed by the circuits of the three semiconductor modules 10. The first phase 5*a* is a V phase of the three-phase alternating-current motor 51. The second phase 5*b* is a U phase of the three-phase alternating-current motor 51. The third phase 5*c* is a W phase of the three-phase alternating-current motor 51.

The motor module 6 is used for a three-phase alternating-current motor 52. The motor module 6 is composed of the six semiconductor modules 10 in the sixth to eleventh rows from the left in FIG. 1. Three phases 6*a*, 6*b*, and 6*c* are formed by the circuits of the six semiconductor modules 10. The first phase 6*a* is a V phase of the three-phase alternating-current motor 52. The second phase 6*b* is a U phase of the three-phase alternating-current motor 52. The third phase 6*c* is a W phase of the three-phase alternating-current motor 52.

The motor module 7 is used for a three-phase alternating-current motor 53. The motor module 7 is composed of the three semiconductor modules 10 in the twelfth to fourteenth rows from the left in FIG. 1. Three phases 7*a*, 7*b*, and 7*c* are formed by the circuits of the three semiconductor modules 10. The first phase 7*a* is a V phase of the three-phase alternating-current motor 53. The second phase 7*b* is a U phase of the three-phase alternating-current motor 53. The third phase 7*c* is a W phase of the three-phase alternating-current motor 53.

Figure 4:
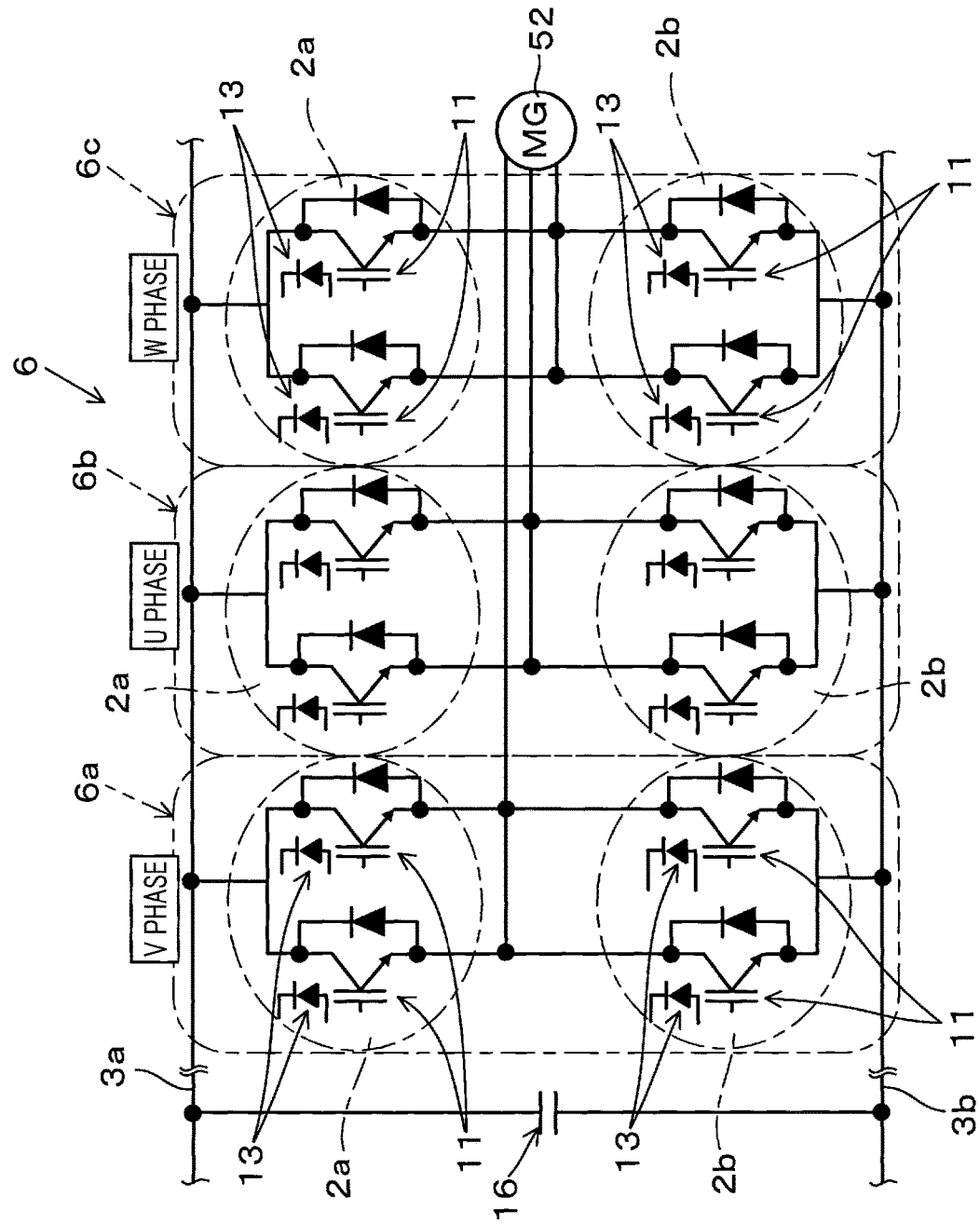
FIG. 4 is a partial circuit diagram of parallel-connection phases for motor driving in the power conversion circuit in FIG. 3.

As shown in FIG. 4, in the motor module 6, the single first phase 6*a* is configured as a parallel-connection phase in which the two semiconductor elements 11 are connected in parallel to each other in each of the upper arm 2*a* and the lower arm 2*b*. In addition, the single second phase 6*b* is configured as a parallel-connection phase in which the two semiconductor elements 11 are connected in parallel to each other in each of the upper arm 2*a* and the lower arm 2*b*. Furthermore, the single third phase 6*c* is configured as a parallel-connection phase in which the two semiconductor elements 11 are connected in parallel to each other in each of the upper arm 2*a* and the lower arm 2*b* In the power conversion circuit 2 described above, a current flows to the semiconductor element 11 of the semiconductor module 10 by a switching operation of the semiconductor element 11. At this time, the element temperature of the semiconductor element 11 increases as a result of heat generation in the semiconductor element 11. The above-described cooler 30 for cooling the power conversion circuit 20 is provided to suppress the increase in element temperature. However, the element temperature of the semiconductor element 11 may become too high when only the cooling effect of the cooler 30 is used.

Therefore, the control unit 8 is configured to perform overheating protection control for the power conversion circuit 2 based on the element temperatures of the semiconductor elements 11. The overheating protection control is control performed to suppress overheating of the semiconductor elements 11.

In addition, the power conversion circuit 2 has parallel-connection phases (referred to, hereafter, as simply phases) 4*a*, 6*a*, 6*b*, and 6*c* in which the two semiconductor elements 11 are connected in parallel to each other in each of the upper arm 2*a* and the lower arm 2*b*. A current imbalance state occurs when currents of differing magnitudes flow through the two semiconductor elements 11 in the phases 4*a*, 6*a*, 6*b*, and 6*c*. Here, the current imbalance state refers to a state in which the current flowing through each semiconductor element 11 differs in magnitude during switching operation of the semiconductor module 10 as a result of individual differences among the semiconductor modules 10 and the switching elements 11, and the like. In such cases, should the temperature information of only the semiconductor element 11 having the smaller current be detected, it is conceivable that the element temperature of the semiconductor element 11 through which the larger current flows will significantly exceed a management temperature (threshold) set in advance. Therefore, the current imbalance state is required to be considered.

According to the present embodiment, during the above-described overheating protection control, focus is placed on the three phases 6*a*, 6*b*, and 6*c* of the motor module 6 of the three-phase alternating-current motor 52. For one of the three phases 6*a*, 6*b*, and 6*c*, the control unit 8 detects the temperature information related to the element temperatures of both of the two semiconductor elements 11 of a target arm. The target arm is either of the upper arm and the lower arm.

Then, when determined that a maximum value of the element temperatures of the two semiconductor elements 11 has reached the management temperature (referred to, hereafter, as a threshold) set in advance based on the detected temperature information, the control unit 8 performs a load adjustment process to reduce the output of the power conversion circuit 2. As the load adjustment process, for example, at least one of first to fourth processes may be used. The first process is a process for reducing the output of the semiconductor module 10 corresponding to the two semiconductor elements 11. The second process is a process for switching OFF all semiconductor modules 10. The third process is a process for reducing the electric power supplied from the power supply 3. The fourth process is a process for stopping the supply of electric power from the power supply 3.

A case in which the first process is used in overheating protection control of the power conversion circuit 2 will be described in detail, below.

Figure 5:
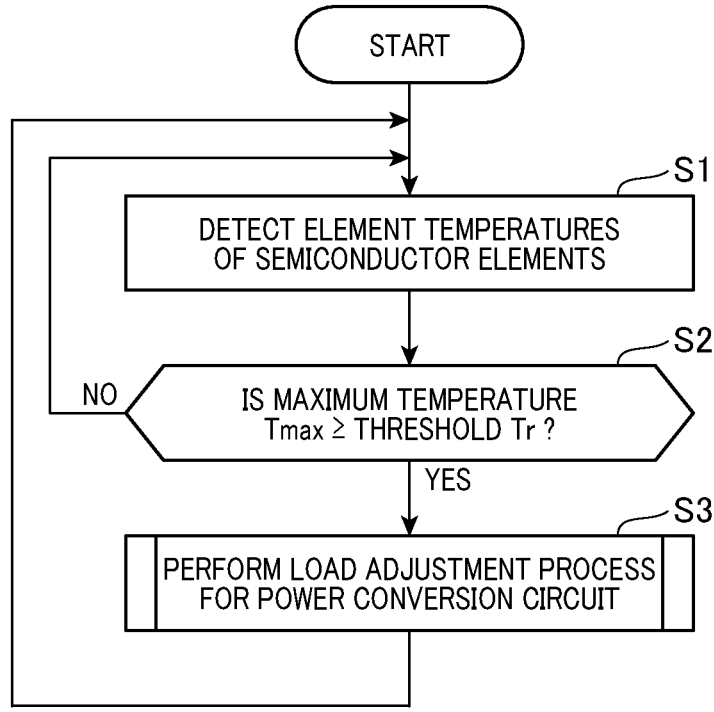
FIG. 5 is a flowchart of an overheating protection process.

As shown in FIG. 5, in overheating protection control, the control unit 8 successively performs processes from steps S1 to S3. Other steps may be added to these steps as required.

At first step S1, the control unit 8 detects the respective element temperatures of the two semiconductor elements 11 selected in advance, based on the temperature information of the two semiconductor elements 11 detected by the temperature-sensitive diode 13. At the first step S1, the element temperatures of the two semiconductor elements 11 are continuously detected during use of the power conversion apparatus 1.

At second step S2, the control unit 8 compares a maximum value T max of the element temperatures detected at first step S1 to a threshold Tr and determines whether or not the maximum value T max has reached the threshold Tr. In this case, the control unit 8 compares the element temperature of either of the two semiconductor elements 11 to the element temperature of the other and uses the higher element temperature as the maximum value T max. At second step S2, when determined that the maximum value T max of the element temperatures has reached the threshold Tr (Yes at second step S2), the control unit 8 proceeds to third step S3. When determined that the maximum value T max of the element temperatures has not reached the threshold Tr (No at second step S2), the control unit 8 returns to first step S1 and repeats the processes at first step S1 and second step S2 until the maximum value T max is determined to have reached the threshold Tr.

At third step S3, the control unit 8 performs the load adjustment process for the power conversion circuit 2. At third step S3, the control unit 8 performs the load adjustment process to reduce the load of the semiconductor module 10 corresponding to the two semiconductor elements 11.

Figure 6:
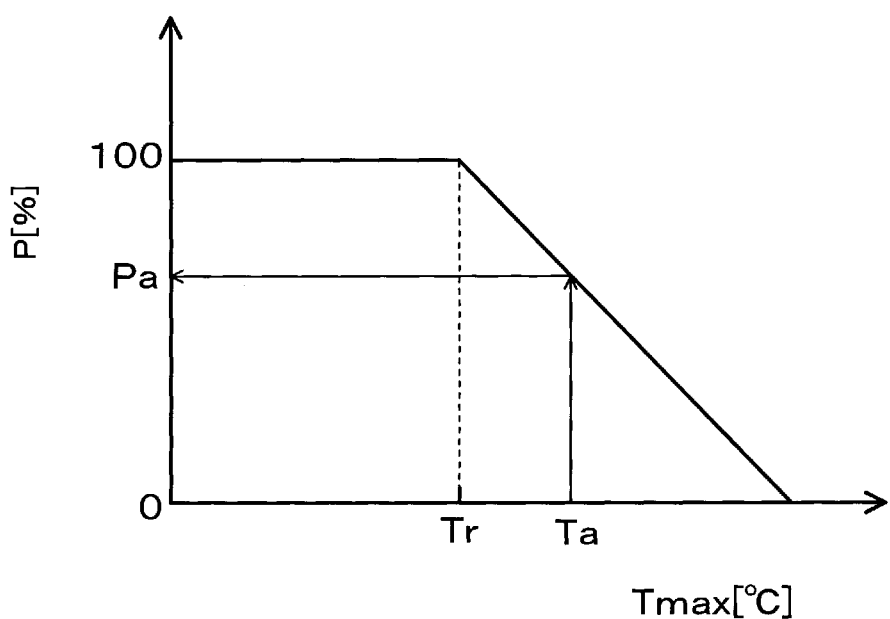
FIG. 6 is a correlation diagram used in a load adjustment process for the power conversion circuit performed at a third step in FIG. 5.

In the load adjustment process, for example, a correlation shown in FIG. 6 is used. The correlation indicates a relationship between the maximum value T max [° C.] of the element temperatures of the two semiconductor elements 11, and load P [%] that is the output of the corresponding semiconductor module 10. The correlation is stored in the control unit 8 in advance. Based on the correlation, the load P is kept at maximum (100%) until the maximum value T max of the element temperatures reaches the threshold Tr. Then, when the maximum value T max of the element temperatures reaches the threshold Tr, the load P is adjusted based on the value of the maximum value T max. For example, when the maximum value T max is Ta, the load P is adjusted to Pa. For example, when the two semiconductor elements 11 of the lower arm 2b of the second phase (U phase) 6b is selected as temperature detection subjects, the load of the semiconductor modules 10 configuring the motor module 6 is adjusted.

The correlation diagram shown in FIG. 6 is an example and can be modified accordingly, as required.

In overheating protection control described above, the element temperatures of the semiconductor elements 11 are detected at a cycle set in advance. Whether or not the load adjustment process is required is determined each time. When the maximum value Tm of the detected element temperatures becomes the threshold Tr or lower, or falls below the threshold Tr, the control unit 8 determines that the load adjustment process is no longer necessary and ends overheating protection control.

Next, the logic behind the selection of the temperature detection subjects from the plurality of semiconductor elements 11 belonging to the three phases 6a, 6b, and 6c of the three-phase alternating-current motor 52 when first step S1 is performed will be described.

Figure 7:
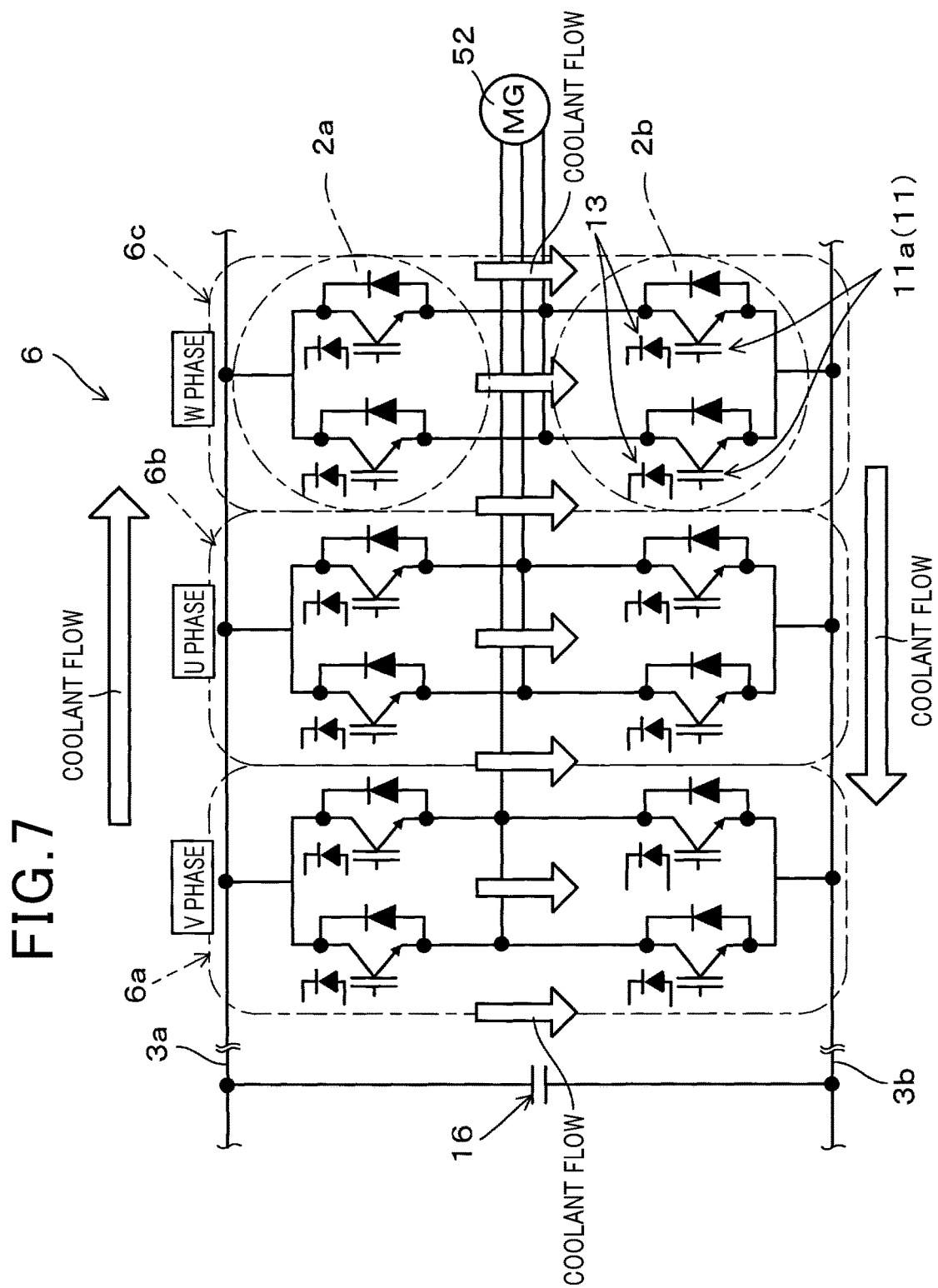
FIG. 7 is a diagram of semiconductor elements selected as temperature detection subjects based on cooling performance of a cooler in FIG. 4.
Figure 8:
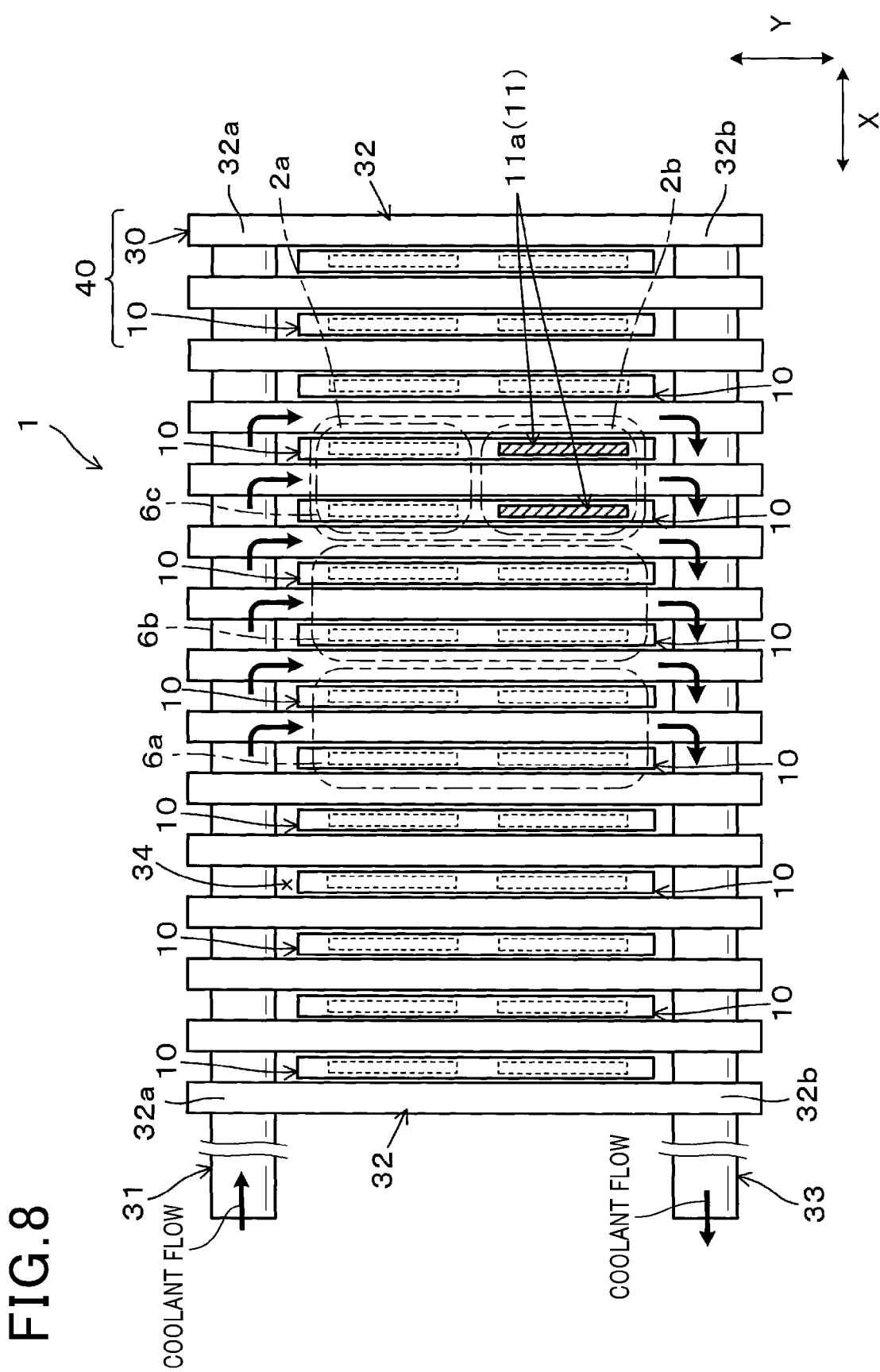
FIG. 8 is a diagram of semiconductor elements selected as the temperature detection subjects based on the cooling performance of the cooler in FIG. 1.

As shown in FIG. 7 and FIG. 8, regarding the three phases 6a, 6b, and 6c, the coolant that flows in from the inflow tube 31 of the cooler 30 flows through the upper-arm side (one arm side) from the phase 6a to the phase 6c. The coolant flows through the respective cooling tubes corresponding to the three phases 6a, 6b, and 6c from the upper-arm side towards the lower-arm side. Then, the coolant that has flowed through the lower-arm side from the phase 6c to the phase 6a flows out from the outflow tube 33.

Based on the flow of coolant described above, among the three phases 6a, 6b, and 6c, the phase 6c is in a position in the cooler 30 at which cooling performance is the lowest. In addition, of the upper arm 2a and the lower arm 2b of the phase 6c, the lower arm 2b is positioned furthest towards the downstream side. That is, the cooling tubes 32 and 32 on both sides of the phase 6c are configured such that the coolant flows from the upper-arm side to the lower-arm side.

Therefore, the lower arm 2b, and the two semiconductor elements 11 of the phase 6c are provided in the position in the cooler 30 at which the cooling performance is the lowest. Specifically, the lower arm 2b, and the two semiconductor elements 11 of the phase 6c are provided in the position of the cooling tube 32 farthest from the inflow tube 31 among the cooling tubes 32 of the cooler 30. Therefore, the two semiconductor elements 11 are placed under conditions in which the semiconductor elements 11 are less easily cooled and the element temperatures more easily increase than the other semiconductor elements 11. The semiconductor elements 11 are those expected to have the highest element temperature during use.

Therefore, on the basis of the cooling performance of the cooler 30, described above, the lower arm 2b of the phase 6c that is the W phase, among the arms of the three phases 6a, 6b, and 6c, is preferably selected as the target arm. The two semiconductor elements 11 belonging to the lower arm 2b (the two semiconductor elements 11a indicated by the shaded portions in FIG. 8) are preferably selected as the temperature detection subjects. In this case, the lower arm 2b that is the target arm includes the two semiconductor elements 11a having the highest element temperatures during use.

The position in the cooler 30 at which the cooling performance is the lowest changes depending on the specific structure of the cooler 30 and the like. Therefore, a position other than the position of the cooling tube 32 farthest from the inflow tube 31 may be the position at which the cooling performance is the lowest.

In addition, the element temperatures of the semiconductor elements 11 during use change depending on factors other than the cooling performance of the cooler 30. Therefore, the semiconductor element 11 to be the temperature detection subject can also be selected based on other factors instead of or in addition to the cooling performance of the cooler 30.

Figure 9:
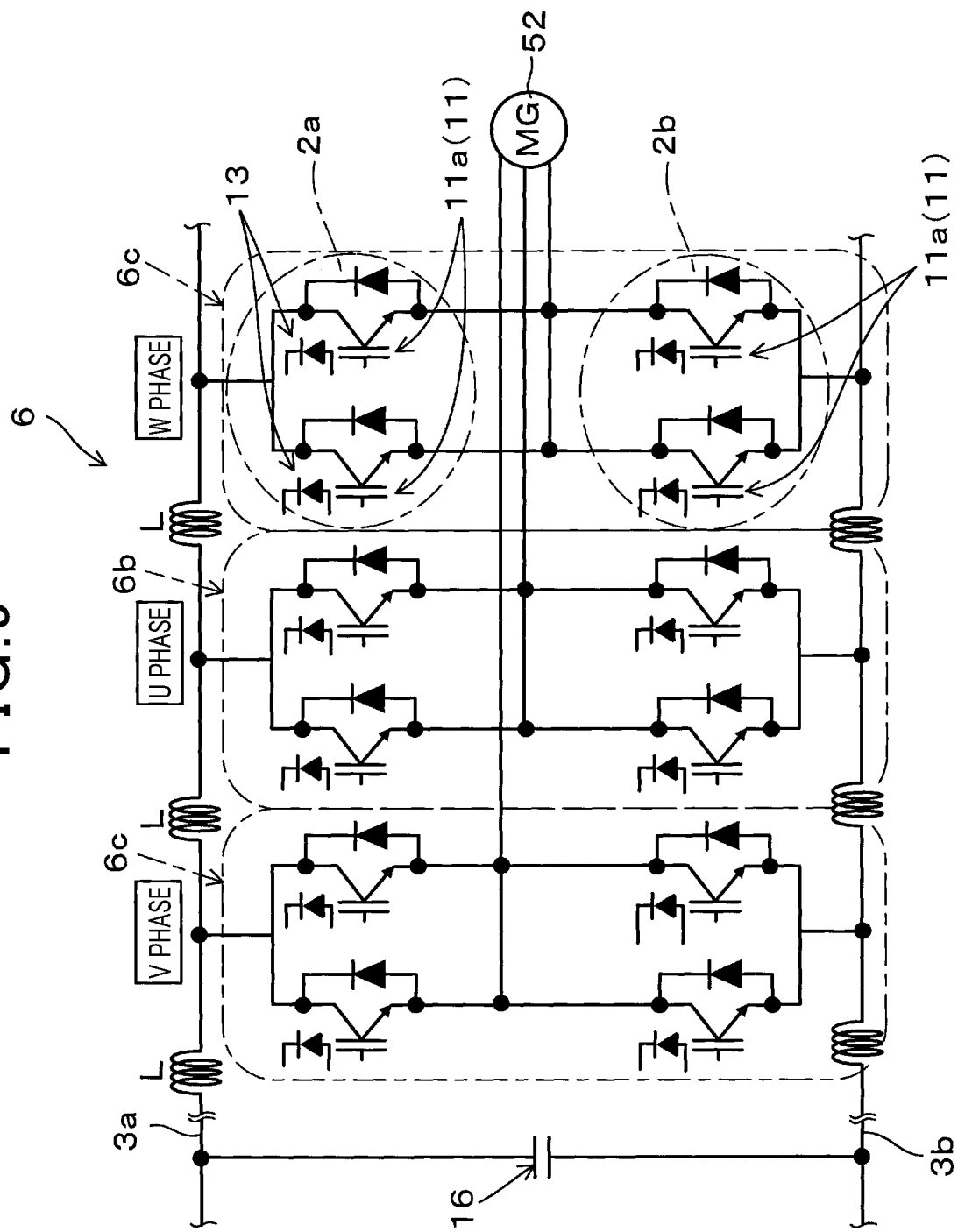
FIG. 9 is a diagram of semiconductor elements selected as the temperature detection subjects based on inductance in FIG. 4.

As shown in FIG. 9, among the three phases 6a, 6b, and 6c of the three-phase alternating-current motor 52, the phase 6c is the farthest from the capacitor 16 that is an electrical storage component. Therefore, when inductance L per unit wiring length is taken into consideration, the phase 6c is the phase in which the inductance from the capacitor 16 is the largest and loss in the semiconductor elements 11 is the greatest. That is, the semiconductor elements 11 belonging to the phase 6c are placed under conditions in which the element temperatures more easily increase than the semiconductor elements 11 belonging to the other two phases 6a and 6b, and are semiconductor elements that are expected to have the highest element temperatures during use.

Therefore, on the basis of the inductance from the capacitor 16, the upper arm 2a or the lower arm 2b of the phase 6c that is the W phase, among the three phases 6a, 6b, and 6c, is preferably selected as the target arm. The two semiconductor elements 11 belonging to the target arm (the two semiconductor elements 11a indicated by the shaded portions in FIG. 9) are preferably selected as the temperature detection subjects. In this case, the target arm is provided in a position at which the inductance from the capacitor 16 is the largest and includes the two semiconductor elements 11a having the highest element temperatures during use.

When the inductance from an electrical storage component is taken into consideration, a component other than the capacitor, such as a battery, can be used as the electrical storage component.

Next, working effects of the above-described power conversion apparatus 1 will be described.

In the power conversion apparatus 1, the temperature information related to the element temperatures of both of the two semiconductor elements 11 of the target arm is detected for overheating protection control. Then, overheating protection control is performed based on the temperature information. Therefore, even should a current imbalance state occur between the two semiconductor elements 11, excessive increase in the element temperatures of the semiconductor elements 11 can be prevented. That is, overheating protection control can be performed on a semiconductor element having a high temperature even when the current imbalance state occurs.

In the power conversion apparatus 1, the semiconductor elements 11 of only the target arm, of the upper arm 2a and the lower arm 2b, are the temperature detection subjects. Therefore, compared to when the semiconductor elements 11 of both arms 2a and 2b are the temperature detection subjects, the number of temperature detection subjects can be reduced. Therefore, processing load placed on the control unit 8 can be reduced and efficiency can be achieved.

In the power conversion apparatus 1, overheating protection control of the semiconductor elements 11 can be performed for the motor module 6 of the three-phase alternating current motor 52.

In the power conversion apparatus 1, as a result of the semiconductor elements 11 to be the temperature detection subjects being selected based on the cooling performance of the cooler 30 or the inductance from the capacitor 16, overheating protection control using the temperature information of the semiconductor element 11 having the highest element temperature during use can be performed.

The present disclosure is not solely limited to the above-described typical embodiment. Various applications and modifications can be considered without departing from the object of the present disclosure. For example, the following embodiments are possible through application of the above-described embodiment.

According to the above-described embodiment, an example is given in which the number of semiconductor elements 11 connected in parallel to each other in each of the upper arm 2a and the lower arm 2a of each of the phases 4a, 6a, 6b, and 6c is two. However, the number of semiconductor elements 11 may be three or more.

According to the above-described embodiment, an example is given in which the three-phase alternating-current motors 51, 52, and 53 are used. However, instead of the three-phase alternating-current motors 51, 52, and 53, a single-phase alternating-current motor can be used. In this case, the number of phases for the single-phase alternating-current motor is two.

According to the above-described embodiment, an example is given in which the semiconductor elements 11 belonging to the phase 6c of the three-phase alternating-current motor 52 are the temperature detection subjects. However, instead of or in addition to the phase 6c, the semiconductor elements 11 belonging to at least either of the other phases 6a and 6b of the three-phase alternating-current motor 52, or the semiconductor elements 11 belonging to the phase 4a for boosting the voltage of the power supply 3 can be the temperature detection subjects.

According to the above-described embodiment, the cooling performance of the cooler 30 and the inductance from an electrical storage component are given as examples of conditions affecting the element temperature of the semiconductor element 11. However, other conditions affecting the element temperature of the semiconductor element 11 can be used instead of the cooling performance and the inductance.

According to the above-described embodiment, overheating protection control in a power conversion apparatus that converts direct-current power to alternating-current power is given as an example. However, overheating protection control can also be applied to a power conversion apparatus that converts alternating-current power to alternating-current power.

According to the above-described embodiment, a case in which a laminated type cooler that uses a coolant is used as the cooler 30 that cools the semiconductor modules 10 is given as an example. However, other types of coolers can also be used instead of the laminated type cooler.

What is claimed is:

1. A power conversion apparatus comprising:
   a power conversion circuit that converts electric power supplied from a power supply and outputs the converted electric power, the power conversion circuit having a parallel-connection phase in which an upper plurality of transistors is connected in parallel to each other in an upper arm connected to a high potential-side wiring of the power supply, and a lower plurality of transistors is connected in parallel to each other in a lower arm connected to a low potential-side wiring of the power supply;
   a plurality of temperature sensors that individually measure temperatures of all of the upper plurality and lower plurality of transistors; and
   a control unit that controls the power conversion circuit and detects, using the plurality of temperature sensors, temperature information related to temperatures of all of the plurality of transistors of a target arm that is either of the upper arm and the lower arm of the parallel-connection phase, the target arm including a transistor that has a highest temperature during use among all of the upper plurality and lower plurality of transistors, and performs overheating protection control of the power conversion circuit based on the detected temperature information.

2. The power conversion apparatus according to claim 1, wherein:
   the power conversion circuit has three phases for a three-phase alternating-current motor, and one of the three phases is the parallel-connection phase.

3. The power conversion apparatus according to claim 1, further comprising:
   a cooler that cools the power conversion circuit,
   wherein the target arm is provided in a position of the cooler at which cooling performance is the lowest.

4. The power conversion apparatus according to claim 1, wherein:
   the power conversion circuit includes an electrical storage component; and
   the target arm is provided in a position at which inductance from the electrical storage component is largest.

5. The power conversion apparatus according to claim 1, wherein:
   the control unit performs a process to reduce output of the power conversion circuit as overheating protection control when it detects that a maximum value of the temperatures of all of the plurality of transistors of the target arm reaches a threshold set in advance.

6. The power conversion apparatus according to claim 2, further comprising:
   a cooler that cools the power conversion circuit, wherein the target arm is provided in a position of the cooler at which cooling performance is the lowest.

7. The power conversion apparatus according to claim 2, wherein:
   the power conversion circuit includes an electrical storage component; and the target arm is provided in a position at which inductance from the electrical storage component is largest.

8. The power conversion apparatus according to claim 2, wherein:
the control unit performs a process to reduce output of the power conversion circuit as overheating protection control when it detects that a maximum value of the temperatures of all of the plurality of transistors of the target arm reaches a threshold set in advance.

9. The power conversion apparatus according to claim 3, further comprising:
an inflow tube of the cooler;
a cooling tube of the cooler that is joined to the power conversion circuit,
wherein coolant flows from the inflow tube to the cooling tube, and
the target arm is provided in a position of the cooling tube that is farthest from the inflow tube.

10. The power conversion apparatus according to claim 6, further comprising:
an inflow tube of the cooler;
a cooling tube of the cooler that is joined to the power conversion circuit,
wherein coolant flows from the inflow tube to the cooling tube, and
the target arm is provided in a position of the cooling tube that is farthest from the inflow tube.

11. The power conversion apparatus according to claim 9, wherein:
the cooling tube is configured such that the coolant flows from one arm side, of the upper arm and the lower arm, to the other arm side.

12. The power conversion apparatus according to claim 10, wherein:
the cooling tube is configured such that the coolant flows from one arm side, of the upper arm and the lower arm, to the other arm side.

* * * * *